US011227551B2

(12) United States Patent
Yamashita et al.

(10) Patent No.: US 11,227,551 B2
(45) Date of Patent: Jan. 18, 2022

(54) DRIVING METHOD AND SYSTEM FOR OLED DISPLAY PANEL

(71) Applicant: EverDisplay Optronics (Shanghai) Co., Ltd., Shanghai (CN)

(72) Inventors: Keitaro Yamashita, Shanghai (CN); Shaodong Ma, Shanghai (CN); Shanglong Wang, Shanghai (CN); Fei Shen, Shanghai (CN)

(73) Assignee: Everdisplay Optronics (Shanghai) Co., Ltd, Shanghai (CN)

( * ) Notice: Subject to any disclaimer, the term of this patent is extended or adjusted under 35 U.S.C. 154(b) by 0 days.

(21) Appl. No.: 16/853,960

(22) Filed: Apr. 21, 2020

(65) Prior Publication Data

US 2021/0134226 A1    May 6, 2021

(30) Foreign Application Priority Data

Nov. 1, 2019 (CN) .......................... 201911061401.7

(51) Int. Cl.
*G09G 3/3266* (2016.01)
*H01L 27/32* (2006.01)

(52) U.S. Cl.
CPC ....... *G09G 3/3266* (2013.01); *H01L 27/3276* (2013.01); *G09G 2300/0861* (2013.01); *G09G 2310/0202* (2013.01); *G09G 2310/08* (2013.01)

(58) Field of Classification Search
CPC ......... G09G 3/3266; G09G 2300/0861; G09G 2310/0202; G09G 2310/08; H01L 27/3276

(Continued)

(56) References Cited

U.S. PATENT DOCUMENTS

| 6,184,874 B1* | 2/2001 | Smith ...................... G09G 3/22 315/169.3 |
| 2011/0057917 A1* | 3/2011 | Ryu ...................... G09G 3/3266 345/211 |
| 2018/0082651 A1 | 3/2018 | Um et al. |

FOREIGN PATENT DOCUMENTS

| CN | 101604514 A | 12/2009 |
| CN | 102122498 A | 7/2011 |

(Continued)

OTHER PUBLICATIONS

The 1st Office Action dated Aug. 31, 2021 for CN patent application No. 201911061401.7.

*Primary Examiner* — Amare Mengistu
*Assistant Examiner* — Gloryvid Figueroa-Gibson
(74) *Attorney, Agent, or Firm* — Qinghong Xu

(57) ABSTRACT

The present disclosure provides a driving method and system for an OLED display panel. The driving method for the OLED display panel includes: controlling a gate line driving circuit of the display panel for each frame image to sequentially output a scanning signal to each gate line of the display panel; and when the gate line driving circuit of the display panel starts to output the scanning signal to one gate line, timing from a starting scanning time of the same scanning gate line; and after the scanning time of the current scanning gate line reaches a preset fixed scanning time, controlling the gate line driving circuit of the display panel to stop outputting the scanning signal to the current scanning gate line. Therefore, the present disclosure does not need to change the gamma curve when the refresh frequency is changed, and screen flicker will not occur, and a seamless dynamic refresh switching of the display panel is realized.

9 Claims, 7 Drawing Sheets

(58) Field of Classification Search
USPC .......................................................... 345/204
See application file for complete search history.

(56) References Cited

FOREIGN PATENT DOCUMENTS

| | | |
|---|---|---|
| CN | 104934010 A | 9/2015 |
| CN | 105654890 A | 6/2016 |
| CN | 107967906 A | 4/2018 |

\* cited by examiner

DRIVING METHOD AND SYSTEM FOR OLED DISPLAY PANEL

CROSS-REFERENCE TO RELATED APPLICATIONS

The present application is based upon and claims priority of Chinese patent application No. 201911061401.7, filed on Nov. 1, 2019, the contents of which are hereby incorporated by reference in its entirety.

TECHNICAL FIELD

The present disclosure relates to the field of display technology, in particular to a method and system for driving an OLED display panel.

BACKGROUND

An AMOLED (Active Matrix Organic Light Emitting Display) display is an active self-luminous display and usually used for large-sized display devices with high resolution, which constructs a pixel circuit with a thin film transistor (TFT) to provide current to the OLED device.

In a driving method of the OLED display panel in the prior art, different gamma curves need to be provided for different refresh frequencies. That is, the gamma curve changes as the refresh frequency changes. Even if the gamma curve is adaptively changed, display brightness of the display panel cannot transition well when two frame rates are switched, resulting in obvious screen flicker visible to naked eyes when the refresh frequency is switched.

SUMMARY

In view of the defects in the prior art, an object of the present disclosure is to provide a driving method and system for an OLED display panel, which does not need to replace a gamma curve when a refresh frequency is changed, and realizes seamless dynamic refresh switching of the display panel.

According to an aspect of the present disclosure, a driving method for an OLED display panel is provided, including:
controlling a gate line driving circuit of the display panel for each frame image to sequentially output a scanning signal to each gate line of the display panel; and
when the gate line driving circuit of the display panel starts to output the scanning signal to one gate line, timing from a starting scanning time of the same scanning gate line; and after the scanning time of the current scanning gate line reaches a preset fixed scanning time, controlling the gate line driving circuit of the display panel to stop outputting the scanning signal to the current scanning gate line.

Optionally, the method further includes the following steps:
when the gate line driving circuit of the display panel starts to output the scanning signal to the one gate line, starting to perform horizontal signal synchronization on a next gate line of the current scanning gate line.

Optionally, the method further includes the following steps:
when the gate line driving circuit of the display panel starts to output the scanning signal to the one gate line, stopping performing the horizontal signal synchronization on the current scanning gate line.

Optionally, before sequentially outputting a scanning signal to each gate line of the display panel, the method further includes the following steps:
receiving refresh frequency data of the display panel, and determining a scanning interval between two adjacent gate lines according to a current refresh frequency and the number of gate lines.

Optionally, determining a scanning interval between two adjacent gate lines according to a current refresh frequency and the number of gate lines includes: determining a current refresh time Ta according to the current refresh frequency, and calculating the scanning interval Tb between two adjacent gate lines by using the following formula:

$$Tb = Ta/N$$

wherein, N is the number of gate lines in the display panel.

Optionally, sequentially outputting a scanning signal to each gate line of the display panel includes the following steps:
when the gate line driving circuit of the display panel controlled to start to output the scanning signal to the one gate line of the display panel, timing the starting scanning time of the current scanning gate line; and
when the interval between the starting scanning time of the current scanning gate line and the current time is equal to the interval Tb, outputting the scanning signal to the next gate line.

Optionally, before sequentially outputting a scanning signal to each gate line of the display panel, the method further includes the following steps:
receiving available refresh frequency data of the display panel, and selecting a highest refresh frequency of the display panel from available refresh frequencies;
determining a shortest scanning interval between two adjacent gate lines according to xe highest refresh frequency and the number of gate lines;
setting the preset fixed scanning time according to the shortest scanning interval between two adjacent gate lines, wherein the preset fixed scanning time is shorter than the shortest interval.

Optionally, determining a shortest scanning interval between two adjacent gate lines includes determining a shortest refresh time Tc according to the highest refresh frequency, and calculating a shortest scanning interval Td between two adjacent gate lines by using the following formula:

$$Td = Tc/N$$

wherein, N is the number of gate lines in the display panel.

An embodiment of the present disclosure further provides a driving system for an OLED display panel, which adopts the driving method for the OLED display panel, and the system includes:
a driving circuit control module, configured to control a gate line driving circuit of the display panel for each frame image to sequentially output a scanning signal to each gate line of the display panel; and
a timing controller, configured to time from a starting scanning time of the same scanning gate line when the gate line driving circuit of the display panel starts to output the scanning signal to one gate line, and send a stopping signal to the driving circuit control module after the scanning time of the current scanning gate line reaches a preset fixed scanning time, such that the driving circuit control module controls the gate line driving circuit of the display panel to stop outputting the scanning signal to the current scanning gate line.

Optionally, the system further includes:
a refresh frequency receiving module, configured to receive refresh frequency data of the display panel;
an interval calculation module, configured to determine a scanning interval between two adjacent gate lines according to a current refresh frequency and the number of gate lines.

The interval calculation module is further configured to select a highest refresh frequency of the display panel from available refresh frequency data of the display panel, determine a shortest scanning interval between two adjacent gate lines according to the highest refresh frequency and the number of gate lines, and set the preset fixed scanning time according to the shortest scanning interval between two adjacent gate lines, wherein the preset fixed scanning time is shorter than the shortest interval.

Compared with the prior art, the driving method and system for the OLED display panel of the present disclosure do not need to change the gamma curve when the refresh frequency is changed, and the screen flicker will not occur when the refresh frequency is switched, thereby achieving a seamless dynamic refresh switching of the display panel and greatly improving the user experience.

BRIEF DESCRIPTION OF THE DRAWINGS

Other features, objects, and advantages of the present disclosure will become more apparent by reading the detailed description of the non-limiting embodiments with reference to the following drawings.

DETAILED DESCRIPTION

Figure 1:
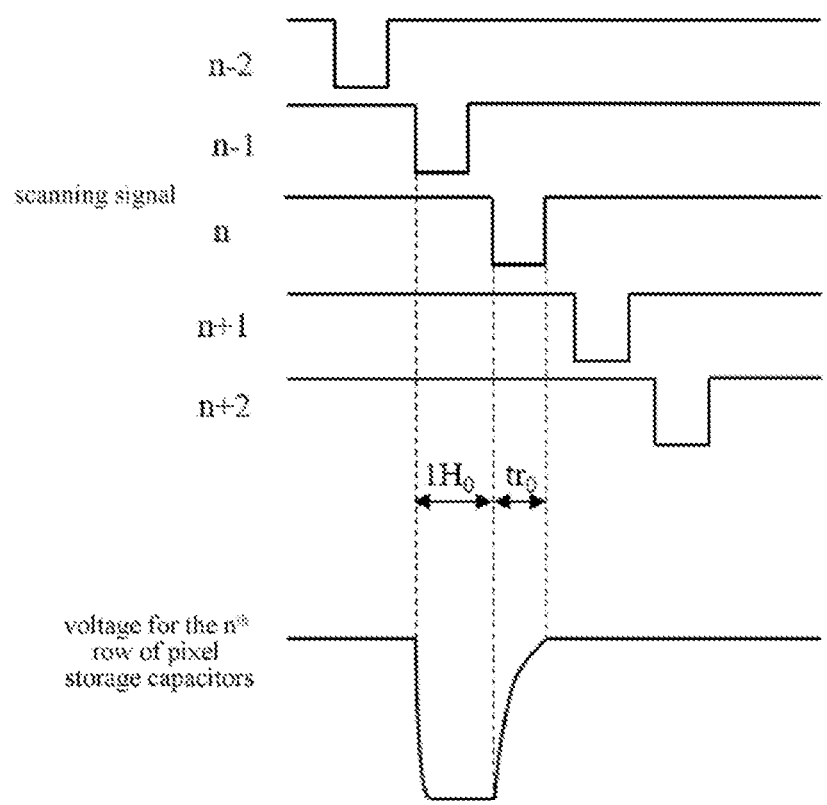
FIG. 1 is a timing diagram of performing line scanning on a display panel at a first refresh frequency in the prior art.

Example embodiments will now be described more fully with reference to the accompanying drawings. However, the embodiments can be implemented in a variety of forms and should not be construed as being limited to the examples set forth herein; rather, these embodiments are provided so that this disclosure will be more comprehensive and complete, so as to convey the idea of the exemplary embodiments to those skilled in this art. The same reference numerals in the drawings denote the same or similar parts, and the detailed description thereof will be omitted.

The features, structures, or characteristics described above may be combined in any suitable manner in one or more embodiments. In the description below, numerous specific details are set forth to provide a thorough understanding of the embodiments of the present disclosure. However, those skilled in the all will appreciate that the technical solution of the present disclosure may be practiced without one or more of the specific details, or other methods, components, materials, and the like may be employed. In other instances, well-known structures, materials or operations are not shown or described in detail to avoid obscuring various aspects of the present disclosure.

Figure 2:
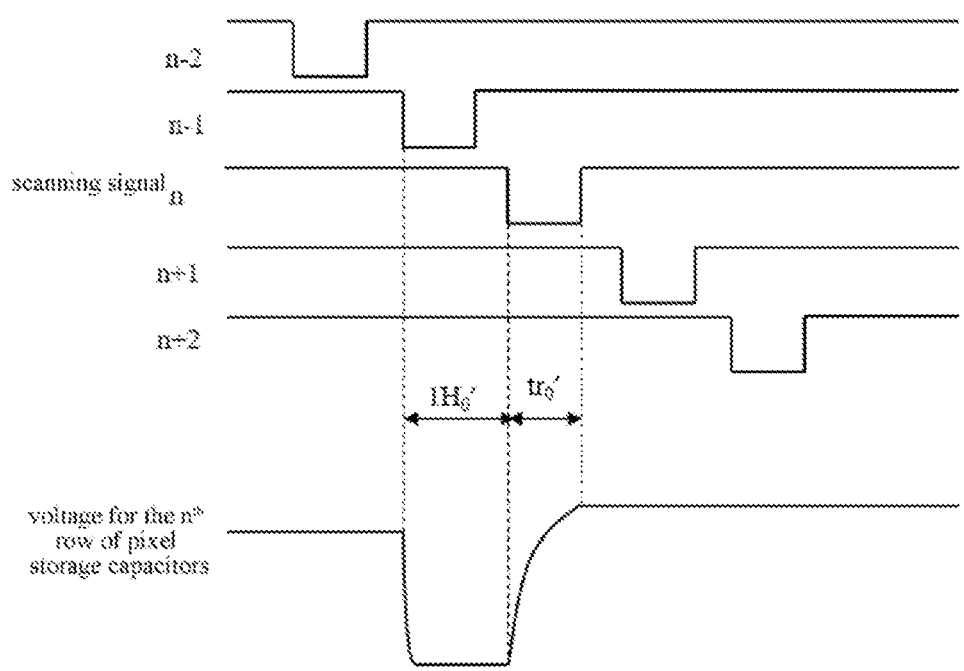
FIG. 2 is a timing diagram of performing line scanning on a display panel at a second refresh frequency in the prior art.

As shown in FIG. 1 and FIG. 2, they are timing diagrams of performing line scanning on a display panel at a first refresh frequency and a second refresh frequency. 60 Hz is taken as an example in FIG. 1, and 40 Hz is taken as an example in FIG. 2.

Figure 3:
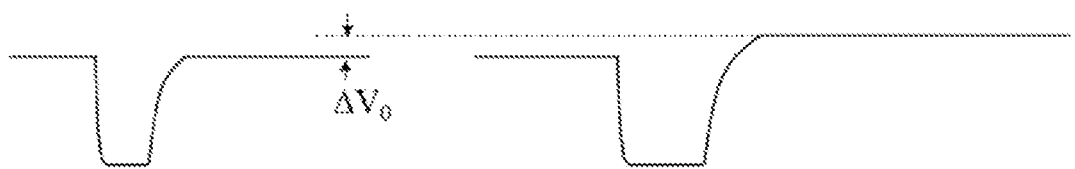
FIG. 3 is a comparison diagram of charging of a pixel capacitor at a first refresh frequency and a second refresh frequency in the prior art.

As can be seen from FIG. 1 and FIG. 2, in the prior art, scanning time of each line, i.e., duration of the scanning signal, changes with change of the refresh frequency. Correspondingly, horizontal synchronization time $1H_0$ also changes with different refresh frequencies, and pixel charging time $tr_0$ also changes with different refresh frequencies. Compared with FIG. 1, the refresh frequency is reduced and time of each refresh is increased in FIG. 2, which causes that the horizontal synchronization time $1H_0$ increases to $1H_0'$, and the pixel charging time $tr_0$ increases to $tr_0'$. This causes a pixel voltage to increase accordingly. As shown in FIG. 3, it is comparison of the pixel voltages at two refresh frequencies, wherein the left side is a pixel charging timing diagram corresponding to FIG. 1, and the right side is a pixel charging tuning diagram corresponding to FIG. 2. When the refresh frequency is changed from 60 Hz to 40 Hz, the pixel voltage is increased by $\Delta V_0$, which will cause a significant change in the brightness of the display panel as the refresh frequency is switched, resulting in obvious flicker visible to naked eyes.

In order to solve this technical problem, the present disclosure provides a driving method for an OLED display panel, so that the pixel voltage is decoupled from the refresh frequency, and the pixel voltage no longer changes with switching of the refresh frequency. Specifically, an embodiment of the present disclosure provides a driving method for an OLED display panel, including following steps:

controlling a gate line driving circuit of the display panel for each frame image to sequentially output a scanning signal to each gate line of the display panel; and when the gate line driving circuit of the display panel starts to output the scanning signal to one gate line, timing from a starting scanning time of the same scanning gate line; and after the scanning time of the current scanning gate line reaches a preset fixed scanning time, controlling the gate line driving circuit of the display panel to stop outputting the scanning signal to the current scanning gate line.

Therefore, the present disclosure decouples the scanning time of each gate line from the refresh frequency by timing the scanning time of each gate line separately, so that the scanning time of each gate line is no longer associated with the refresh frequency, then the charging time of the pixel is fixed time, and it is also ensured that the pixel voltage is still a fixed value under different refresh frequencies, so that screen flicker does not occur when the refresh frequency is switched, and there is no need to replace the gamma curve when the refresh frequency is switched either.

Figure 4:
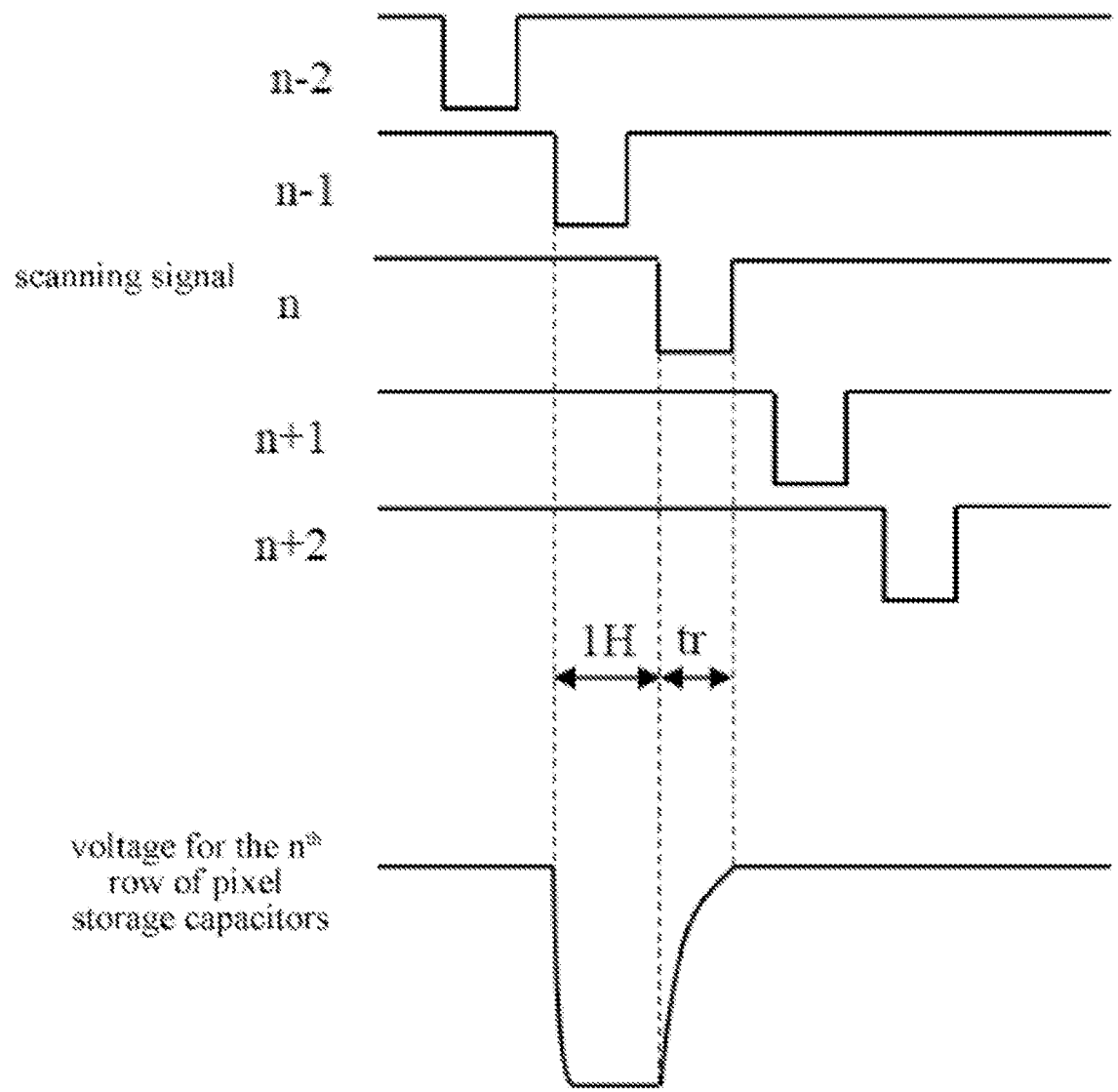
FIG. 4 is a timing diagram of performing line scanning on a display panel at a first refresh frequency according to an embodiment of the present disclosure.
Figure 5:
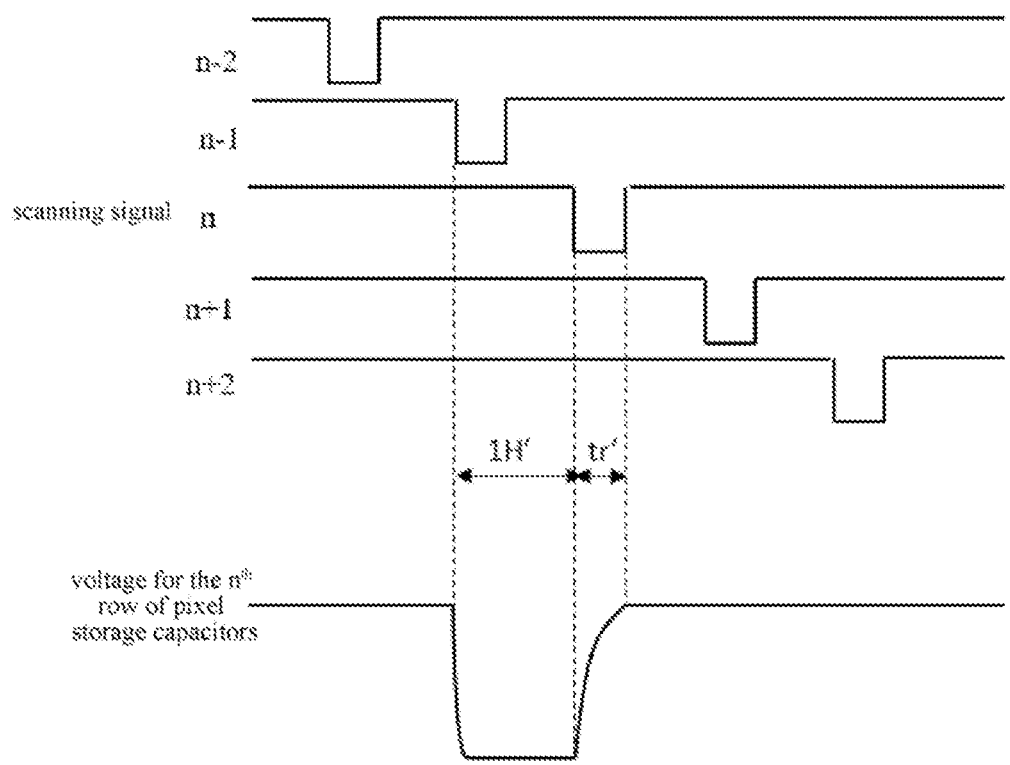
FIG. 5 is a timing diagram of performing line scanning on a display panel at a second refresh frequency according to an embodiment of the present disclosure.
Figure 6:
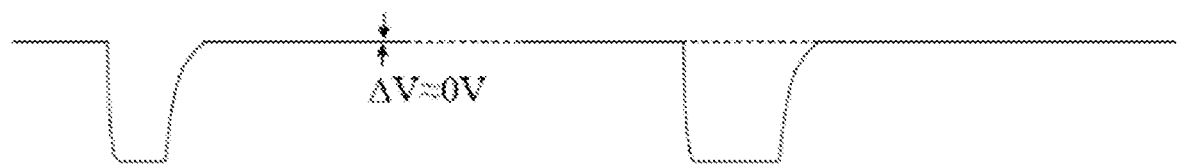
FIG. 6 is a comparison diagram of charging of a pixel capacitor at a first refresh frequency and a second refresh frequency in an embodiment of the present disclosure.

FIG. 4 and FIG. 5 show timing diagrams of performing line scanning on a display panel by the driving method of the embodiment of the present disclosure at a first refresh frequency and a second refresh frequency, respectively. 60 Hz is taken as an example in FIG. 4, and 40 Hz is taken as an example in FIG. 5. It can be seen from FIG. 4 and FIG. 5 that when the refresh frequency is switched from 60 Hz to 40 Hz, the horizontal synchronization time of each pixel capacitor also changes, increasing from 1H to 1H'. However, since the scanning time of each gate line is maintained at a preset fixed scanning time value, the scanning time of each gate line does not change, and the pixel charging time of each pixel capacitor does not change, tr=tr'. Therefore, the pixel voltage remains unchanged under different refresh frequencies. As shown in FIG. 6, the left side is a timing diagram of charging a pixel capacitor at the first refresh frequency, and the right side is a timing diagram of charging a pixel capacitor at the second refresh frequency. ΔV between pixel voltages is equal to or approximately equal to 0, that is, the pixel voltage does not change.

In FIG. 4 and FIG. 5, 1H and 1H' are different and change with the refresh frequency. In other alternative implementations, 1H and 1H' may also be set to the same value. That is, under different refresh frequencies, the horizontal synchronization time of each pixel capacitor is the same. A timing controller can also be used to control the horizontal synchronization time, that is, a preset horizontal synchronization time value is set. When the horizontal synchronization is performed on the pixel capacitor, the timing controller is used to start timing. When the timing reaches the preset horizontal synchronization time value, the horizontal synchronization is stopped.

As shown in FIG. 4, in this embodiment, the driving method for the display panel further includes: when the gate line driving circuit of the display panel starts to output the scanning signal to the one gate line, starting to perform horizontal signal synchronization on a next gate line of the current scanning gate line. Further, when the gate line driving circuit of the display panel starts to output the scanning signal to the one gate line, the horizontal signal synchronization on the current scanning gate line is stopped. That is, for one gate line, its horizontal signal synchronization time (H-sync time) is equal to an interval between time points when two adjacent gate lines start scanning, hereinafter referred to as the scanning interval between two adjacent gate lines. Therefore, the horizontal signal synchronization time varies with change of the refresh frequency.

In this embodiment, before sequentially outputting a scanning signal to each gate line of the display panel, the method further includes a step of calculating a scanning interval between two adjacent gate lines, and specifically includes: receiving refresh frequency data of the display panel, and determining a scanning interval between two adjacent gate lines according to a current refresh frequency and the number of gate lines. When a gate line driving circuit is used to scan each gate line, the starting scanning time of each gate line is determined according to the scanning interval between two adjacent gate lines.

In this embodiment, determining a scanning interval between two adjacent gate lines according to a current refresh frequency and the number of gate lines includes: determining a current refresh time Ta (Ta=1/f, f is the current refresh frequency) according to the current refresh frequency, and calculating the scanning interval Tb between two adjacent gate lines by using the following formula:

$$Tb=Ta/N=1/fN$$

wherein, N is the number of gate lines in the display panel. That is, scanning of all the gate lines is performed within the current refresh time Ta. Herein, the scanning interval Tb between two adjacent gate lines is also equal to the horizontal synchronization time 1H, 1H' of each gate line.

In this embodiment, sequentially outputting a scanning signal to each gate line of the display panel includes the following steps:
when the gate line driving circuit of the display panel is controlled to start to output the scanning signal to the one gate line of the display panel, timing the starting scanning time of the current scanning gate line; and
when the interval between the starting scanning time of the current scanning gate line and the current time is equal to the interval Tb, outputting the scanning signal to the next gate line.

In this embodiment, before sequentially outputting a scanning signal to each gate line of the display panel, the method further includes a step of determining the preset fixed scanning time. Taking FIG. 4 as an example, since the preset fixed scanning time tr is always shorter than the horizontal synchronization time 1H, when the refresh frequency is highest, the horizontal synchronization time 1H is the shortest. Therefore, the preset fixed scanning time tr needs to meet the requirement of being less than the horizontal synchronization time 1H corresponding to the highest refresh frequency. Specifically, determining the preset fixed scanning time includes the following sub-steps:
receiving available refresh frequency data of the display panel, and selecting a highest refresh frequency of the display panel from available refresh frequencies;
determining a shortest scanning interval between two adjacent gate lines according to xe highest refresh frequency and the number of gate lines;
setting the preset fixed scanning time according to the shortest scanning interval between two adjacent gate lines, wherein the preset fixed scanning time is shorter than the shortest interval. In the embodiment, when the preset fixed scanning time is set, the time difference between the preset fixed scanning time and the shortest time interval can be selected as needed, for example, 0.003 s, 0.005 s, which are all within the protection scope of the present disclosure.

Further, in this embodiment, determining a shortest scanning interval between two adjacent gate lines includes determining a shortest refresh time Tc (Tc=1/$f_{max}$, $f_{max}$ is the highest refresh frequency) according to the highest refresh frequency, and calculating a shortest scanning interval Td between two adjacent gate lines by using the following formula:

$$Td=Tc/N=1/f_{max}N$$

wherein, N is the number of gate lines in the display panel.

In the embodiment, receiving available refresh frequency data of the display panel may be obtained from a GPU (graphics card) and a ICON (screen driver board) of a display device including the display panel, and the received refresh frequency data may include a current refresh frequency and all available refresh frequencies of the display device, i.e., the refresh frequencies that can be supported by the display device.

Figure 7:
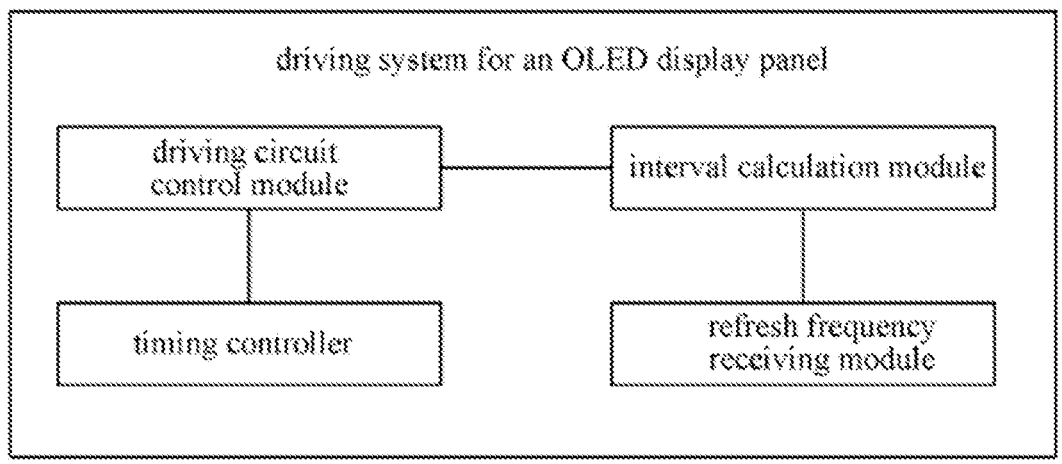
FIG. 7 is a schematic structural diagram of a driving system for an OLED display panel according to an embodiment of the present disclosure.

As shown in FIG. 7, an embodiment of the present disclosure further provides a driving system for an MED display panel, which adopts the driving method for the OLED display panel, and the system includes:
a driving circuit control module, configured to control a gate line driving circuit of the display panel for each frame image to sequentially output a scanning signal to each gate line of the display panel; and
a timing controller, configured to time from a starting scanning time of the same scanning gate line when the gate line driving circuit of the display panel starts to output the scanning signal to one gate line, and send a stopping signal to the driving circuit control module after the scanning time of the current scanning gate line reaches a preset fixed scanning time, such that the driving circuit control module controls the gate line driving circuit of the display panel to stop outputting the scanning signal to the current scanning gate line.

Therefore, the present disclosure decouples the scanning time of each gate line from the refresh frequency by adopting the timing controller to time the scanning time of each gate line separately. Even if the refresh frequency is switched, there will be no change in the scanning time, that is, the charging time of the pixel capacitor, and the pixel voltage will not change either, so that screen flicker does not occur when the refresh frequency is switched, and there is no need to set different gamma curves for different refresh frequencies either.

The driving system for the OLED display panel of the present disclosure can be integrated in a screen driving board of a display panel or other control devices of a display device, to optimize driving of the OLED display panel.

In this embodiment, the driving system for the OLED display panel further includes:

a refresh frequency receiving module, configured to receive refresh frequency data of the display panel. The refresh frequency receiving module can be obtained from a GPU (graphics card) and a ICON (screen driver board) of a display device including the display panel, and the received refresh frequency data may include a current refresh frequency and all available refresh frequencies of the display device, i.e., the refresh frequencies that can be supported by the display device.

The driving system for the OLED display panel further includes: an interval calculation module, configured to determine a scanning interval between two adjacent gate lines according to a current refresh frequency and the number of gate lines. Specifically, the interval calculation module may use the above formula. Tb=Ta/N=1/fN to calculate and obtain the scanning interval between two adjacent gate lines, and thus obtaining the above-mentioned horizontal synchronization times 1H, 1H'.

Further, the interval calculation module is further configured to select a highest refresh frequency of the display panel from available refresh frequency data of the display panel, determine a shortest scanning interval between two adjacent gate lines according to the highest refresh frequency and the number of gate lines, and set the preset fixed scanning time according to the shortest scanning interval between two adjacent gate lines, wherein the preset fixed scanning time is shorter than the shortest interval. Specifically, the interval calculation module may use the above formula Td=Tc/N=1/$f_{max}$N to calculate and obtain the shortest interval, and then determine the preset fixed scanning time according to the shortest interval.

Compared with the prior art, the driving method and system for the OLED display panel of the present disclosure do not need to change the gamma curve when the refresh frequency is changed, and the screen flicker does not occur when the refresh frequency is switched, thereby achieving a seamless dynamic refresh switching of the display panel and greatly improving the user experience The specific embodiments of the present disclosure have been described above. It should be understood that the present disclosure is not limited to the above specific embodiments, and those skilled in the art can make various changes or modifications within the scope of the claims, which does not affect the essence of the present disclosure.

What is claimed is:

1. A driving method for an OLED display panel, comprising:

controlling a gate line driving circuit of the display panel for each frame image to sequentially output a scanning signal to each gate line of the display panel; and when the gate line driving circuit of the display panel starts to output the scanning signal to one gate line, starting to count a time from a starting scanning time of a current scanning gate line; and after a scanning time of the current scanning gate line reaches a preset fixed scanning time, controlling the gate line driving circuit of the display panel to stop outputting the scanning signal to the current scanning gate line, wherein the method further comprises:

when the gate line driving circuit of the display panel starts to output the scanning signal to the one gate line, starting to perform horizontal signal synchronization on a next gate line of the current scanning gate line, such that a scanning time of each gate line is decoupled from a refresh frequency by starting to count a time from the scanning time of each gate line separately, the scanning time of each gate line is no longer associated with the refresh frequency, a charging time of a pixel is fixed, a pixel voltage is also a fixed value under different refresh frequencies, and there is no need to replace a gamma curve when the refresh frequency is switched.

2. The driving method for the OLED display panel according to claim 1, wherein the method further comprises:

when the gate line driving circuit of the display panel starts to output the scanning signal to the one gate line, stopping performing the horizontal signal synchronization on the current scanning gate line.

3. The driving method for the OLED display panel according to claim 1, wherein before sequentially outputting the scanning signal to each gate line of the display panel, the method further comprises:

receiving refresh frequency data of the display panel, and determining a scanning interval between two adjacent gate lines according to a current refresh frequency and the number of gate lines.

4. The driving method for the OLED display panel according to claim 3, wherein determining the scanning interval between two adjacent gate lines according to the current refresh frequency and the number of gate lines comprises: determining a current refresh time Ta according to the current refresh frequency, and calculating the scanning interval Tb between two adjacent gate lines by using following formula:

$$Tb=Ta/N$$

wherein, N is the number of gate lines in the display panel.

5. The driving method for the OLED display panel according to claim 4, wherein sequentially outputting the scanning signal to each gate line of the display panel comprises:

when the gate line driving circuit of the display panel is controlled to start to output the scanning signal to the one gate line of the display panel, timing the starting scanning time of the current scanning gate line; and when an interval between the starting scanning time of the current scanning gate line and the current time is equal to the interval Tb, outputting the scanning signal to the next gate line.

6. The driving method for the OLED display panel according to claim 1, wherein before sequentially outputting the scanning signal to each gate line of the display panel, the method further comprises:

receiving available refresh frequency data of the display panel, and selecting a highest refresh frequency of the display panel from available refresh frequencies;

determining a shortest scanning interval between two adjacent gate lines according to the highest refresh frequency and the number of gate lines; and setting the preset fixed scanning time according to the shortest scanning interval between two adjacent gate lines, wherein the preset fixed scanning time is shorter than the shortest scanning interval.

7. The driving method for the OLED display panel according to claim 6, wherein determining the shortest scanning interval between two adjacent gate lines comprises determining a shortest refresh time Tc according to the highest refresh frequency, and calculating the shortest scanning interval Td between two adjacent gate lines by using following formula:

$$Td=Tc/N$$

wherein, N is the number of gate lines in the display panel.

8. A driving system for an OLED display panel, adopting the driving method for the OLED display panel according to claim 1, and the system comprising:

a processor;

a memory for storing executable instructions of the processor, wherein the processor is configured to:

control the gate line driving circuit of the display panel for each frame image to sequentially output the scanning signal to the each gate line of the display panel; and start to count the time from the starting scanning time of the current scanning gate line when the gate line driving circuit of the display panel starts to output the scanning signal to the one gate line, and control the gate line driving circuit of the display panel to stop outputting the scanning signal to the current scanning gate line after the scanning time of the current scanning gate line reaches the preset fixed scanning time, wherein the processor is further configured to:

start to perform horizontal signal synchronization on the next gate line of the current scanning gate line, when the gate line driving circuit of the display panel starts to output the scanning signal to the one gate line, such that the scanning time of each gate line is decoupled from the refresh frequency by starting to count the time from the scanning time of each gate line separately, the scanning time of each gate line is no longer associated with the refresh frequency, the charging time of the pixel is fixed, the pixel voltage is also the fixed value under different refresh frequencies, and there is no need to replace the gamma curve when the refresh frequency is switched.

9. The driving system of the OLED display panel according to claim 8, wherein the processor is further configured to:

receive refresh frequency data of the display panel; and determine a scanning interval between two adjacent gate lines according to a current refresh frequency and the number of gate lines, select a highest refresh frequency of the display panel from available refresh frequency data of the display panel, determine a shortest scanning interval between two adjacent gate lines according to the highest refresh frequency and the number of gate lines, and set the preset fixed scanning time according to the shortest scanning interval between two adjacent gate lines, wherein the preset fixed scanning time is shorter than the shortest scanning interval.

\* \* \* \* \*